United States Patent [19]
Storey

[11] Patent Number: 5,231,360
[45] Date of Patent: Jul. 27, 1993

[54] MULTI-RANGE VOLTAGE AMPLIFIER HAVING MULTIPLYING DIGITAL/ANALOG CONVERTERS AND PROGRAMMABLE FILTER USING MULTIPLYING DAC IN FEEDBACK LOOP

[75] Inventor: Michael C. Storey, Garland, Tex.

[73] Assignee: Texas Instruments Incorporated, Dallas, Tex.

[21] Appl. No.: 900,212

[22] Filed: Jun. 17, 1992

[51] Int. Cl.$^5$ .............................................. H03G 3/00
[52] U.S. Cl. ...................................... 330/86; 330/282
[58] Field of Search .................. 307/520, 521; 330/86, 330/110, 129, 141, 281, 282, 303

[56] References Cited

U.S. PATENT DOCUMENTS 4,868,516  9/1989  Henderson et al. ................ 330/86
4,918,397  4/1990  Kidger ................................. 330/86
5,034,699  7/1991  Powell ............................ 330/282 X Primary Examiner—Steven Mottola
Attorney, Agent, or Firm—Stanton C. Braden; Richard L. Donaldson

[57] ABSTRACT

A multiple range amplifier capable of providing a large number of ranges with great accuracy is provided by a circuit free of discrete resistors and which includes two inverting operational amplifiers and two, two-quadrant multiplying DACs which are externally controllable. The output of the first inverting amplifier is fed back through the first DAC and is also fed through the second DAC to the second inverting amplifier. Each of the DACs is externally controllable to provide the desired range with great precision. The gain of the system is the product of the gain of the two amplifiers. Also, a programmable filter is provided to optimize system performance, for example, in the removal of noise. This is accomplished by providing a fundamental filter circuit having an operational amplifier, a two quadrant multiplying DAC, a capacitor and several resistors. The output of the operational amplifier is fed back to the input via a capacitor and a DAC input control circuit and an RC circuit. The effective capacitance in the circuit is regulated by control of the DAC via the DAC input control.

20 Claims, 1 Drawing Sheet

MULTI-RANGE VOLTAGE AMPLIFIER HAVING MULTIPLYING DIGITAL/ANALOG CONVERTERS AND PROGRAMMABLE FILTER USING MULTIPLYING DAC IN FEEDBACK LOOP

BACKGROUND OF THE INVENTION

1. Field of the Invention

This invention relates to amplifiers having a gain factor controllable with great precision and a programmable or controllable filter wherein the control is provided by a digital to analog converter (DAC).

2. Brief Description of the Prior Art

Amplifiers are often required which are capable of providing multiple ranges of amplification wherein the range to be utilized can be controlled. Such prior art multiple range amplifiers have been limited to a small number of ranges, typically three, such amplifiers not being easily adjusted to a binary scheme. In addition, such prior art multiple range amplifiers have been built using discrete components including an operational amplifier, a multiplexer to select the proper resistors corresponding to the selected range and an output amplifier. The number of ranges is limited by the size (N) of the multiplexer and the number of resistors, usually precision, is N+2 (number of ranges plus 2). One problem encountered with such prior art amplifiers is that each of the resistors in the resistor chain, by which the amplification range is determined, must be a precision resistor to provide a high degree of accuracy and such resistors are very costly and require high installation costs. Furthermore, even the costly resistors obtainable may not provide the degree of accuracy required and are also not readily available. A further problem is that, in the event the resistors do not provide the degree of accuracy required, there is no practical way to adjust for minor errors. Accordingly, the degree of accuracy continually obtainable with such prior art amplifiers has been less than is desired for many operations.

In automatic test equipment, measurement of low amplitude DC signals is common. Often these signals contain unwanted AC signals, generally described as "noise". Failure to remove these "noise" signals causes unstable and erroneous measurements. The use of "high efficiency" switching power supplies in test systems has added greatly to the noise problems. Due to the switching action, electrical noise in the range of 30 Hz to 50 KHz is introduced and is generally removed by some form of filtering action. Test systems that provide an averaging function generally use one of two methods. In one method, many individual readings are taken and the average is computed. These multiple readings can require considerable CPU time. In the second method, a multi-range time interval integrator circuit is used. This circuit requires a large number of analog components and a programmable counter/timer. The analog portion of the circuit controls the voltage and time constant scaling while the counter controls the integration period. With this arrangement, the time constant and voltage scaling are not independent. This lack of independence prevents the use of the long time constants on the lower voltage signals.

SUMMARY OF THE INVENTION

In accordance with the present invention, there is provided a multiple range amplifier capable of providing a large number of ranges with great accuracy. Briefly, this is accomplished by providing a circuit free of discrete resistors and which includes two inverting operational amplifiers and two, two-quadrant multiplying DACs which are externally controllable. The output of the first inverting amplifier is fed back through the first DAC and is also fed through the second DAC to the second inverting amplifier. Each of the DACs is externally controllable to provide the desired range with great precision. The gain of the system is the product of the gain of the two amplifiers.

Further in accordance with the present invention, a programmable filter is provided to optimize system performance, for example, in the removal of noise. This is accomplished by providing a fundamental filter circuit having an operational amplifier, a two quadrant multiplying DAC, a capacitor and several resistors. The output of the operational amplifier is fed back to the input via a capacitor and a DAC input control circuit and an RC circuit. The effective capacitance in the circuit is determined by control of the DAC via the DAC input control.

DESCRIPTION OF THE PREFERRED EMBODIMENTS

Figure 1:
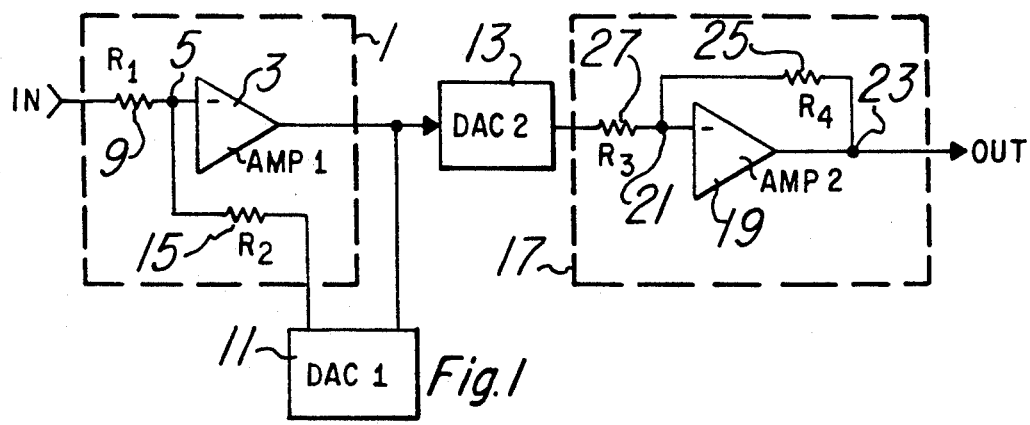
FIG. 1 is a circuit diagram of an multiple range amplifying circuit in accordance with the present invention.

Referring to FIG. 1, there is shown a multiple range amplifying circuit in accordance with the present invention. The amplifying circuit includes a first amplifier 1 which comprises an operational amplifier 3 having an input terminal 5 and an output terminal 7. The input to the amplifier 1 is coupled to the input terminal 5 via a resistor 9. The output of amplifier 3 at output terminal 7 is coupled to the inputs to two standard two quadrant multiplying DACs 11 and 13. DAC 11 operates as a feedback control for the amplifier 1 and DAC 13 operates as an input attenuator for the amplifier 17.

Each of the DACs is externally controllable by applying a selected digital signal to control inputs thereof as is well known in the art, DAC 11 controlling the feedback to the input terminal 5 via a resistor 15. DAC 13 is also similarly externally controllable and provides the input to amplifier 17 which is composed of an operational amplifier 19 having input terminal 21 and output terminal 23 with a feedback resistor 25 coupled from the output terminal 23 to the input terminal 25. A resistor 27 is coupled between the output of the DAC 13 and the input terminal 21. The output terminal 23 is the output of the amplifying circuit. Each of the resistors 9, 15, 25 and 27 is preferably integrated as opposed to being a discrete element.

The gain, $G_0$, of the circuit of FIG. 1 is the product of the gain, $G_1$, of amplifier 1 and the gain, $G_2$, of amplifier 17 or $G_0 = G_1 \times G_2$.

The gain, $G_1$, of amplifier 1 is a function of the resistors 9 and 15 and $B_1$, where $B_1 = N_1/FS =$ the DAC value of DAC 11, where the FS value of the DAC is the sum of all of the bits and $N_1$ is the number that is programmed into the DAC and is the decimal equivalent of the weighted bit pattern sent by the controlling computer thereto. If follows that:

$$G_1 = -R_{15}/(R_9B_1) = -R_{15}FS/R_9N_1$$

The gain, $G_2$, of amplifier 17 is a function of the resistors 25 and 27 and $B_2$, where $B_2 = N_2/FS =$ the DAC value of DAC 13. It follows that:

$$G_2 = -R_{25}B_2/R_{27} = -R_{25}N_2/R_{27}FS$$

Since $G_0 = G_1 \times G_2 = (R_{15}R_{25}/R_9R_{27}) \times N_2/N_1$.

For the case where $R_{15}R_{25} = R_5R_{27}$, $G_0 = N_2/N_1$

It follows from the above that, for example, in the case where 12 bit DACs are utilized, the DACs can be programmed to more than 16 million ($1.6 \times 10^7$) gain combinations, though some of the mathematical combinations would not be available (e.g. $N_1$ cannot be zero) and others may produce duplicate gain values. The best gain control for any combination of $N_2/N_1$ occurs when the numerator, $N_2$ is as large as possible.

As a first example, assuming the desire to provide a gain of 5 from the circuit of FIG. 1, the DACs 11 and 13 are programmed so that $N_1 = 800$ and $N_2 = 4000$ to provide $G_0 = 4000/800 = 5$. A change of one bit for $N_2$ will yield a small change in $G_0$. For example, if $N_2 = 4001$, then $G_0 = 4001/800 = 5.00125$ and if $N_2 = 3999$, then $G_0 = 3999/800 = 4.99875$. Hence, a change of $\pm 0.025\%$ corresponds to one bit.

As a second example, assuming the desire to provide a gain of 5 from the circuit of FIG. 1, the DACs 11 and 13 are programmed so that $N_1 = 160$ and $N_2 = 800$ to provide $G_0 = 800/160 = 5$. A change of one bit for $N_2$ will yield a change in $G_0$. For example, if $N_2 = 801$, then $G_0 = 801/160 = 5.00625$ and if $N_2 = 799$, then $G_0 = 799/160 = 4.99375$. Hence, a change of $\pm 0.125\%$ corresponds to one bit.

It can be seen that even very small changes in the gain of the amplifier system of FIG. 1 can be easily effected by changes in the programming of one or both of the DACs 11 and 13.

It follows that the circuit of FIG. 1 does not require precision resistors and the associated cost, quality and delivery problems. Due to the high resolution, gain corrections can be accomplished via programming of the DACs 11 and 13. Thus, resistor changes and variable resistors are not required. Due to the monolithic nature of the DACs and amplifiers, the temperature gradient errors are reduced. Since the resistors and FET switch of the prior art are eliminated, the surface area required for the circuit will be reduced.

The amplifier system of FIG. 1 can be cascaded with another identical or similar amplifier system wherein the output 23 of the first amplifier system serves as the input for the following amplifier system. This arrangement would provide a very fine adjustment of the gain such that, essentially, one stage would operate as a course adjustment and the second stage would operate as a fine adjustment.

Figure 2:
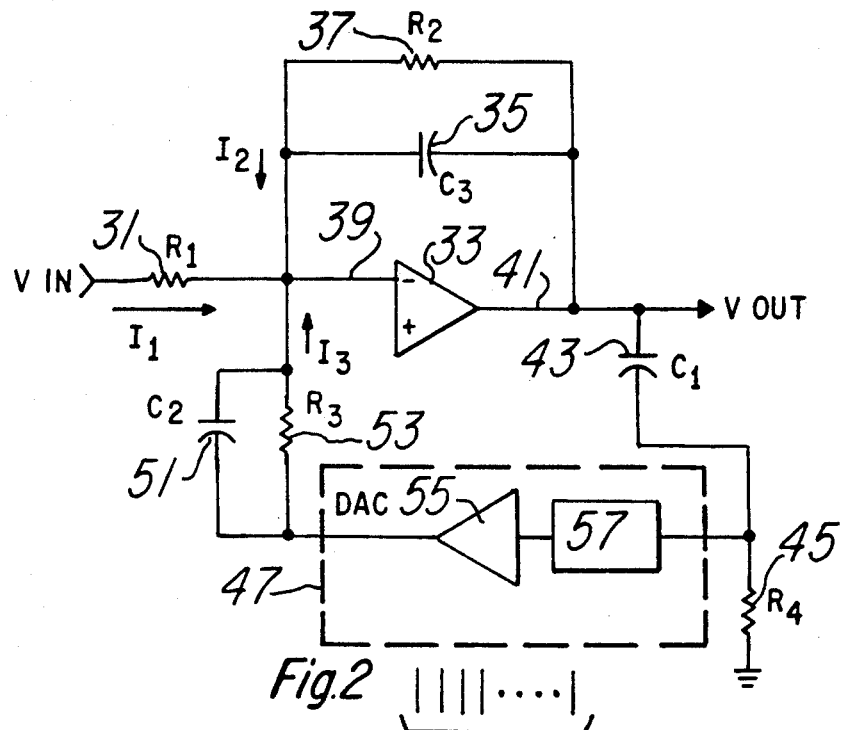
FIG. 2 is a circuit diagram of a programmable filter in accordance with the present invention.

Referring now to FIG. 2, there is shown a programmable filter which is capable of performing a time integration using a relatively small amount of hardware and allows the time constant to be programmed externally. The input pulse train travels through a resistor 31 to an operational amplifier 33 having a capacitor 35 and a resistor 37 each coupled across the input terminal 39 and the output terminal 41 thereof. The output terminal 41 is AC coupled to the DAC input via a capacitor 43. The resistor 45 represents the input resistance of the DAC 47 and could be augmented with additional resistance. Two quadrant multiplying DAC circuit 47, which is externally controllable via a DAC input control 49, is coupled to the junction of the capacitor 43 and resistor 45 and to the input terminal 39 via the parallel combination of a capacitor 51 and a resistor 53. By programming the DAC 47 via the DAC controller 49, the ratio of the AC feedback from output to input of amplifier 33 is controlled.

The amplifier 55 shown as a part of the DAC 47 is a buffer amplifier which permits current from the DAC to be output at much higher value than could have been fed back directly through capacitor 43. The box 57 represents the resistors and switches which make up a standard two quadrant multiplying DAC. Accordingly, the RC network composed of capacitor 51 and resistor 53 permits the equivalent of a very large capacitive feedback due to the current gain through the feedback circuit. This permits control of the effective size of capacitor 43 within the circuit and presents the appearance that capacitor 43 is variable merely by programming the input to the DAC 47 via DAC input control 49. The starting value of the effective capacitance of capacitor 43 within the circuit, prior to operation of the DAC 47, is determined by the values of resistors 31, 37 and 53, which are fixed. Furthermore, a large effective capacitance is obtained by the present circuit without the necessity of using a large valued and accordingly large dimensioned capacitor.

In the circuit of FIG. 2, the DC forward transfer gain is set by the ratio of the resistance of resistor 37 to resistor 31. Therefore, in the static or DC state, the output voltage at terminal 41 will be the negative of the input voltage to the circuit multiplied by the gain or $V_{out} = -V_{in}(R_{37}/R_{31})$. The network formed by capacitor 43 and resistor 45 is a highpass network that is part of the feedback path for the operational amplifier 33. Since the highpass network is in the feedback path, the effect is that of a low pass filter. The DAC 47 serves as an amplitude control and buffer for the AC voltage feedback signal. The buffered feedback voltage is converted to a current by resistor 53. Since the sum of all the currents into the amplifier input node 39 must equal zero, the effective time constant is controlled by the DAC 47. Capacitors 51 and 35 provide compensation and stability, respectively.

In the time domain, the effective time constant can be approximated by the following equations:

$$T = [(R_{31} \times R_{45} \times C_{43})/R_{53}]D$$

where
T = time constant of a single stage
D = decimal equivalent of the value programmed into the DAC and is the sum of the bit weights $$T(n) = T[1/[(2^{1/n})^{\frac{1}{2}} - 1]]$$

where
T(n) is the time constant of single state
n is the number of cascaded stages
In the frequency domain, the 3 db frequency limit (fH) is given in the following equations:

$$fH = 0.35R_{53}/(2.2(R_{31} \times R_{45} \times C_{43}))D$$

where
fH is the upper frequency limit.

$$fH(n) = fH[(2^{1/n})^{\frac{1}{2}} - 1]$$

where
fH is the frequency limit of a single stage
n is the number of cascaded stages The above equations relating to the programmable filter of FIG. 2 have been derived empirically.

The circuit of FIG. 2 has several unique properties in that (1) it provides a programmable band width over a large range, (2) small capacitors can be use to achieve large time constants, (3) the voltage scaling and frequency response functions are independent, (4) only two precision resistors are required ($R_{31}$, $R_{37}$), (5) multiple circuits can be easily cascaded and (6) voltage and frequency domains can be easily tailored.

Figure 3:
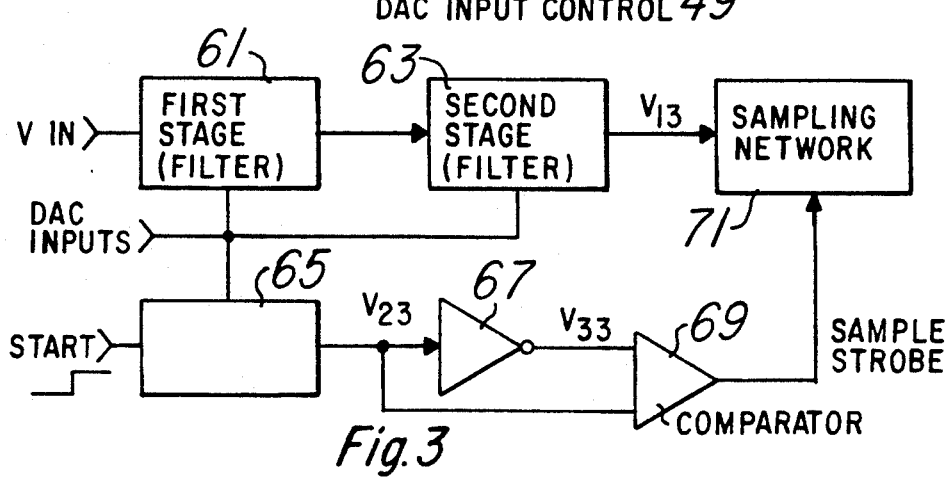
FIG. 3 is a block diagram of an average circuit with sample time control using the programmable filter of FIG. 2.

Referring now to FIG. 3, there is provided an average circuit with sample time control for providing a variable time constant which utilizes the programmable filter of FIG. 2. Used as a programmable time constant, the programmable filter circuit of FIG. 2 is used to control the point in time where a sample is taken on the output of a filter used, for example, for averaging. First and second stage programmable filter circuits 61 and 63 are cascaded to provide an overall in phase output. A third programmable filter circuit 65 is used in conjunction with an amplifier 67 and voltage comparator 69. The time constant of the timer circuit is selected to be greater than that of the filters. This greater time constant insures that the point in time where the two timing signals are equal occurs after the filter output is flat. Since the DACs are all the same type, and since they are all programmed with the same value, the sample time changes as the filter characteristics are changed.

The circuit is initially turned on and the input signal is pulsed. The equivalent RC time constant of the circuit is slowly charged to a steady state value. It is necessary to wait long enough to take the sample so that the charging circuit charges up and provides a true value. With large devices, the wait is long and with small devices the wait is short.

By connecting the circuits 61 and 63 in cascade, the first and second stage filters provide first and second levels of integration, the output of which goes to the sampling network 71 which can be a measuring circuit, a digital voltmeter or the like. A start pulse, which is used to start the entire operation, is the input to filter 65. The filter 65 has a different timing ratio from filters 61 and 63 and generates a strobe signal to the sampling network 71 via amplifier 67 and comparator 69 which takes a sample from the filter 63 at the appropriate time.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modification.

I claim:

1. A multiple range amplifier system which comprises:
   (a) a first amplifier having an input terminal and an output terminal;
   (b) a first selectively controllable digital to analog converter coupled between said input terminal and said output terminal;
   (c) a second amplifier having an input terminal and an output terminal; and
   (d) a second selectively controllable digital to analog converter coupled between the output terminal of said first amplifier and the input terminal of said second amplifier;
   (e) the gain of said amplifier system being a function of the selective control of said first and second converters.

2. The system of claim 1 wherein said first and second amplifiers are operational amplifiers.

3. The system of claim 1 wherein said first and second digital to analog converters are two quadrant multiplying digital to analog converters.

4. The system of claim 2 wherein said first and second digital to analog converters are two quadrant multiplying digital to analog converters.

5. The system of claim 1 further including an additional substantially identical amplifier system wherein the input terminal of the first amplifier of said additional amplifier system is coupled to the output terminal of said second amplifier.

6. The system of claim 2 further including an additional substantially identical amplifier system wherein the input terminal of the first amplifier of said additional amplifier system is coupled to the output terminal of said second amplifier.

7. The system of claim 3 further including an additional substantially identical amplifier system wherein the input terminal of the first amplifier of said additional amplifier system is coupled to the output terminal of said second amplifier.

8. The system of claim 4 further including an additional substantially identical amplifier system wherein the input terminal of the first amplifier of said additional amplifier system is coupled to the output terminal of said second amplifier.

9. A programmable filter which comprises:
   (a) an amplifier having an input terminal and an output terminal; and
   (b) a first feedback circuit coupled between said input terminal and said output terminal comprising:
      (i) a capacitor coupled via a first resistor between said output terminal and a source of reference voltage; and
      (ii) a selectively controllable digital to analog converter coupled between the terminal of said capacitor remote from said output terminal and said input terminal to control the ratio of a-c feedback between the output of said amplifier and the input of said amplifier.

10. The filter of claim 9 further including an RC circuit coupled between said converter and said input terminal.

11. The filter of claim 9 wherein said amplifier is an operational amplifier.

12. The filter of claim 10 wherein said amplifier is an operational amplifier.

13. The filter of claim 9 wherein said converter is a two quadrant multiplying digital to analog converter.

14. The filter of claim 10 wherein said converter is a two quadrant multiplying digital to analog converter.

15. The filter of claim 11 wherein said converter is a two quadrant multiplying digital to analog converter.

16. The filter of claim 12 wherein said converter is a two quadrant multiplying digital to analog converter.

17. The system of claim 1 further including a first resistor coupled to the input of said first amplifier, a second resistor coupled in series with said first converter, a third resistor coupled between said second converter and said input terminal of said second amplifier and a fourth resistor coupled between said output terminal of said second amplifier and said input terminal of said second amplifier, the gain of said system further being a function of the ratio of said second and fourth resistors and the ratio of said first and third resistors.

18. The system of claim 17 wherein the product of the resistance of said second and fourth resistors is equal to the product of the resistance of said first and third resistors.

19. The filter of claim 10 further including a second resistor coupled to said input terminal, a third resistor included in a second feedback circuit between said input terminal and said output terminal and a forth resistor included in said first feedback circuit, the time constant of said filter being a function of said resistors, said capacitor and the selective control of said converter.

20. The filter of claim 19 wherein the time constant of said filter is the product of the resistances of said first, second and third resistors divided by the resistance of said fourth resistor, the value thereof being divided by the selective control of said converter.

* * * * *